(12) United States Patent
Yamamoto et al.

(10) Patent No.: US 11,320,736 B2
(45) Date of Patent: May 3, 2022

(54) PATTERN FORMING MATERIAL AND PATTERN FORMING METHOD

(71) Applicant: KIOXIA CORPORATION, Tokyo (JP)

(72) Inventors: Ryosuke Yamamoto, Aichi (JP); Seiji Morita, Tokyo (JP); Norikatsu Sasao, Kanagawa (JP); Koji Asakawa, Kanagawa (JP); Tomoaki Sawabe, Tokyo (JP); Shinobu Sugimura, Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 117 days.

(21) Appl. No.: 16/123,095

(22) Filed: Sep. 6, 2018

(65) Prior Publication Data
US 2019/0218321 A1    Jul. 18, 2019

(30) Foreign Application Priority Data

Jan. 17, 2018 (JP) .............................. JP2018-005913

(51) Int. Cl.
*H01L 21/308* (2006.01)
*H01L 21/311* (2006.01)
*G03F 7/09* (2006.01)
*C08F 220/08* (2006.01)
(Continued)

(52) U.S. Cl.
CPC ............ *G03F 7/091* (2013.01); *C08F 120/08* (2013.01); *C08F 120/28* (2013.01); *C08F 212/08* (2013.01); *C08F 220/08* (2013.01); *C08F 220/283* (2020.02); *G03F 7/0035* (2013.01); *G03F 7/0047* (2013.01); *G03F 7/094* (2013.01);
(Continued)

(58) Field of Classification Search
CPC .......................... H01L 21/308; H01L 21/31144
See application file for complete search history.

(56) References Cited

U.S. PATENT DOCUMENTS

| 9,458,144 B2 | 10/2016 | Fujiwara et al. |
| 2004/0265745 A1 * | 12/2004 | Sho ........................... G03F 7/40 430/311 |

(Continued)

FOREIGN PATENT DOCUMENTS

| JP | H6-250391 A | 9/1994 |
| JP | H7-140662 A | 6/1995 |

(Continued)

OTHER PUBLICATIONS

Biswas et al., "New Insight into the Mechanism of Sequential Infiltration Synthesis from Infrared Spectroscopy," Chemistry of Materials, 26:6135-6141 (2014).

*Primary Examiner* — Thomas T Pham
(74) *Attorney, Agent, or Firm* — Finnegan, Henderson, Farabow, Garrett & Dunner L.L.P.

(57) ABSTRACT

A pattern forming material according to an embodiment is a pattern forming material comprising a polymer composed of a plurality of monomer units bonded to each other. Each of the monomer units includes an ester structure having a first carbonyl group and at least one second carbonyl group bonded to the ester structure. A second carbonyl group farthest from a main chain of the polymer constituting the pattern forming material among second carbonyl groups is in a linear chain state.

12 Claims, 10 Drawing Sheets

(51) Int. Cl.
    *C08F 212/08*     (2006.01)
    *C08F 120/08*     (2006.01)
    *G03F 7/00*     (2006.01)
    *G03F 7/004*     (2006.01)
    *G03F 7/20*     (2006.01)
    *C08F 120/28*     (2006.01)
    *G03F 7/40*     (2006.01)
    *H01L 21/033*     (2006.01)
    *C08F 220/28*     (2006.01)
    *H01L 27/11582*     (2017.01)

(52) U.S. Cl.
    CPC ............ *G03F 7/2043* (2013.01); *G03F 7/405* (2013.01); *H01L 21/0332* (2013.01); *H01L 21/31144* (2013.01); *H01L 27/11582* (2013.01)

(56) References Cited

U.S. PATENT DOCUMENTS

2010/0129753 A1*   5/2010   Yamada ............ C08F 299/0435
                                                      430/280.1
2013/0105440 A1*   5/2013   Lu ........................ G03F 7/027
                                                      216/41
2018/0173109 A1*   6/2018   Gronheid ............. G03F 7/0002

FOREIGN PATENT DOCUMENTS

| JP | 4514347 B | 7/2010 |
| JP | 2012-83387 A | 4/2012 |
| JP | 2015-22228 A | 2/2015 |
| JP | 2015-227326 A | 12/2015 |

\* cited by examiner

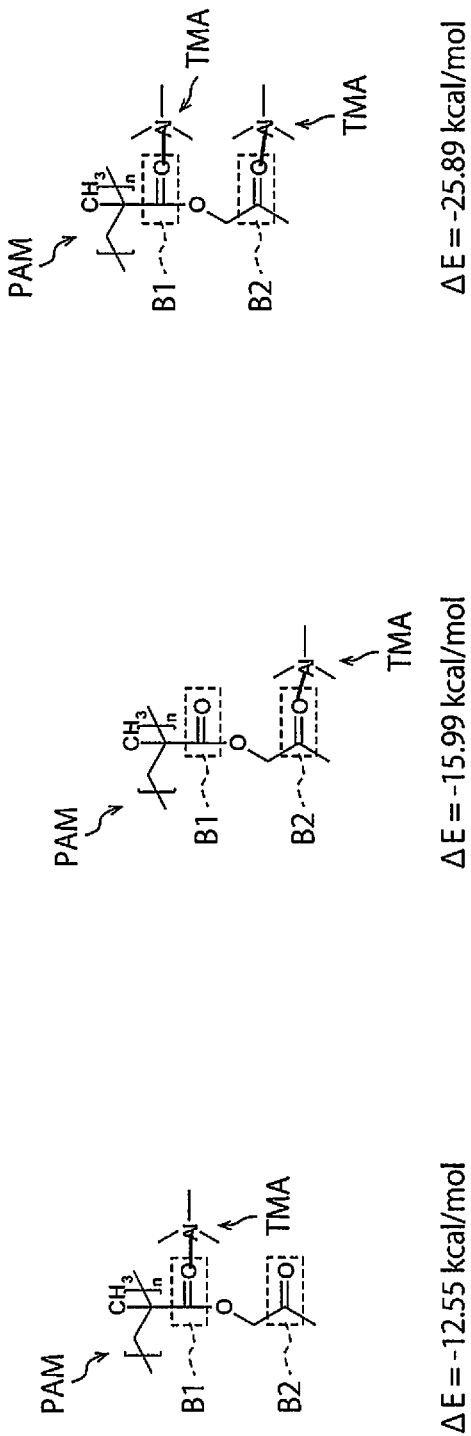

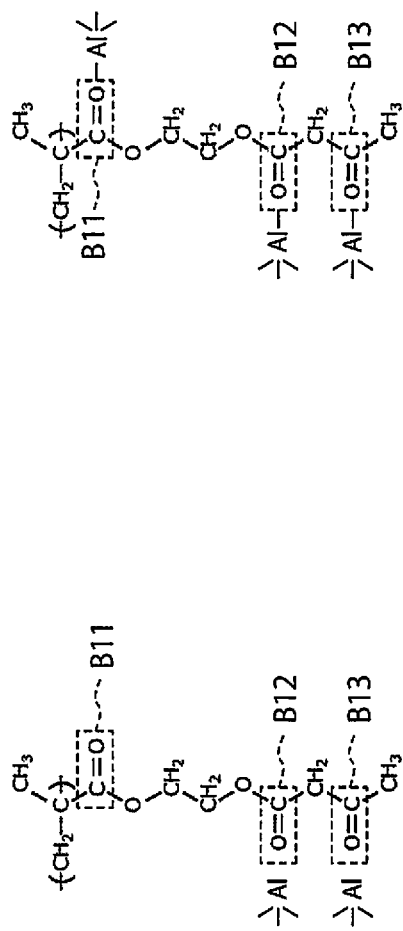

|  |  | ![B1 structure with B2, B3 chain] | ![B1 structure with cyclohexane B3] | ![B1 structure with lactone B3] |
|---|---|---|---|---|
| B1 | ΔE (kcal/mol) | -12.79 | -11.86 | -9.81 |
| B2 | ΔE (kcal/mol) | -19.43 | -15.88 | -15.01 |
| B3 | ΔE (kcal/mol) | -19.56 | -17.90 | -17.80 |

| | M1-H | M1-Me | M2-H | M2-Me | M3-H | M3-Me | M4-H | M4-Me | M5-H | M5-Me |
|---|---|---|---|---|---|---|---|---|---|---|
| M1-H | 20%~30% | | | | | | | | | |
| M1-Me | 20%~30% | 20%~30% | | | | | | | | |
| M2-H | 30%~40% | 30%~40% | 30%~40% | | | | | | | |
| M2-Me | 40%~50% | 40%~50% | 40%~50% | 30%~40% | | | | | | |
| M3-H | 30%~40% | 30%~40% | 30%~40% | 20%~30% | 30%~40% | | | | | |
| M3-Me | 40%~50% | 40%~50% | 40%~50% | 30%~40% | 40%~50% | 30%~40% | | | | |
| M4-H | 30%~40% | 30%~40% | 30%~40% | 20%~30% | 30%~40% | 30%~40% | 30%~40% | | | |
| M4-Me | 40%~50% | 40%~50% | 40%~50% | 30%~40% | 40%~50% | 30%~40% | 30%~40% | 20%~30% | | |
| M5-H | 40%~50% | 40%~50% | 40%~50% | 30%~40% | 40%~50% | 40%~50% | 40%~50% | 30%~40% | 40%~50% | |
| M5-Me | 30%~40% | 30%~40% | 30%~40% | 40%~50% | 30%~40% | 40%~50% | 30%~40% | 40%~50% | 30%~40% | 30%~40% |

FIRST MONOMER UNIT (columns) / SECOND MONOMER UNIT (rows)

FIG. 9

| SECOND MONOMER UNIT \ FIRST MONOMER UNIT | M1-H | M1-Me | M2-H | M2-Me | M3-H | M3-Me | M4-H | M4-Me | M5-H |
|---|---|---|---|---|---|---|---|---|---|
| St | 10%~20% | 10%~20% | 20%~30% | 10%~20% | 10%~20% | 10%~20% | 10%~20% | 10%~20% | 20%~30% |
| St-OH | 10%~20% | 10%~20% | 20%~30% | 10%~20% | 10%~20% | 10%~20% | 10%~20% | 10%~20% | 20%~30% |
| MMA | 20%~30% | 10%~20% | 10%~20% | 10%~20% | 20%~30% | 20%~30% | 20%~30% | 10%~20% | 10%~20% |
| MAA | 20%~30% | 10%~20% | 10%~20% | 10%~20% | 20%~30% | 20%~30% | 20%~30% | 10%~20% | 10%~20% |
| EMA | 20%~30% | 10%~20% | 10%~20% | 10%~20% | 20%~30% | 20%~30% | 20%~30% | 10%~20% | 10%~20% |
| EAA | 20%~30% | 10%~20% | 10%~20% | 10%~20% | 20%~30% | 20%~30% | 20%~30% | 10%~20% | 10%~20% |
| HEMA | 20%~30% | 20%~30% | 20%~30% | 20%~30% | 20%~30% | 20%~30% | 20%~30% | 20%~30% | 20%~30% |
| HEAA | 20%~30% | 20%~30% | 20%~30% | 20%~30% | 20%~30% | 20%~30% | 20%~30% | 20%~30% | 20%~30% |

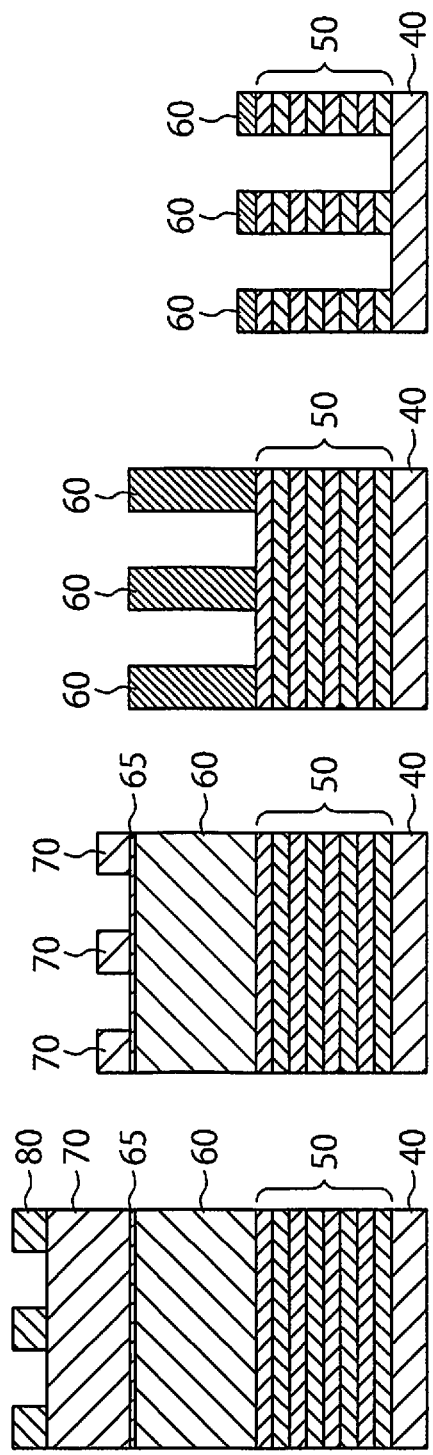

PATTERN FORMING MATERIAL AND PATTERN FORMING METHOD

CROSS REFERENCE TO RELATED APPLICATIONS

This application is based upon and claims the benefit of priority from the prior Japanese Patent Application No. 2018-005913, filed on Jan. 17, 2018, the entire contents of which are incorporated herein by reference.

FIELD

The embodiments of the present invention relate to a pattern forming material and a pattern forming method.

BACKGROUND

A technique to process a material into a pattern with a high aspect ratio is demanded in a semiconductor manufacturing process. When a material is processed, a patterned mask is formed on the material and the material is processed by dry etching using the mask. However, when the aspect ratio of the pattern of the material is high, the mask requires a high resistance to etching because the mask is exposed to an etching gas for a long time.

BRIEF DESCRIPTION OF THE DRAWINGS

FIGS. 2A to 2C illustrate the stabilization energies ΔE when TMA is brought close to PAcMA;

FIGS. 3A to 4B illustrate the stabilization energies ΔE when TMA is brought close to PacacEMA having three carbonyl groups;

FIG. 8 is a table indicating a relation between the combination of monomer units constituting the pattern forming material and the film increase rate obtained by metallization of the pattern forming material according to the first embodiment;

FIG. 9 is a table indicating a relation between the combination of monomer units constituting a pattern forming material and the film increase rate obtained by metallization of the pattern forming material according to a second embodiment; and FIG. 10A to FIG. 11D are sectional views illustrating an example of a pattern forming method according to a fourth embodiment.

DETAILED DESCRIPTION

Figure 1C:
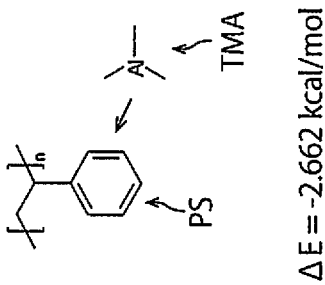
FIGS. 1A to 1C illustrate the stabilization energy ΔE when TMA is brought close to PMMA or PS.

Embodiments will now be explained with reference to the accompanying drawings. The present invention is not limited to the embodiments. The drawings are schematic or conceptual, and the ratios and the like among respective parts may not be the same as those of actual products. In the present specification and the drawings, elements identical to those described with respect to the foregoing drawings are denoted by like reference characters and detailed explanations thereof are omitted as appropriate.

A pattern forming material according to an embodiment is a pattern forming material comprising a polymer composed of a plurality of monomer units bonded to each other. Each of the monomer units includes an ester structure having a first carbonyl group and at least one second carbonyl group bonded to the ester structure. A second carbonyl group farthest from a main chain of the polymer constituting the pattern forming material among second carbonyl groups is in a linear chain state.

(Pattern Forming Material)

When a processing target material is processed into a pattern with a high aspect ratio, a mask serving as a pattern forming material is exposed to an etching gas for a long time. Therefore, the mask preferably has a high etching resistance.

A carbon film deposited by a CVD (Chemical Vapor Deposition) method is generally used as a mask. However, deposition of carbon by the CVD method takes a long time.

In contrast thereto, in the present embodiment, after a pattern forming material is formed, the pattern forming material is impregnated with metal and is bonded thereto. This metallizes the pattern forming material and increases the etching resistance. Such a pattern forming material can be formed in a shorter time than in the carbon deposition by the CVD method.

In order to further enhance the etching resistance, it is preferable that a metallic compound is adsorbed to the pattern forming material at a high density. In order to enable a large quantity of a metallic compound to be adsorbed, to which part of the pattern forming material metal adsorbs was verified. The result of the verification indicated that metal selectively adsorbed to carbonyl groups. That is, it is found that a metallic compound can be contained at a high density in the pattern forming material when the density of carbonyl groups in the pattern forming material is high.

The present embodiment is described below in more detail.

(Mechanism of Metallization)

When a metallic compound precursor (hereinafter, also simply "precursor") to be used in a CVD method or an ALD (Atomic Layer Deposition) method is exposed to a polymer, a metallic compound is deposited in the polymer. For example, when TMA (Trimethylaluminum) serving as a precursor is exposed to PMMA (Polymethylmethacrylate) serving as a polymer using an ALD apparatus, an aluminum oxide or a hydroxide is deposited in the PMMA. It is considered that the aluminum oxide or the hydroxide is formed because TMA approaches a carbonyl group in PMMA and then electrostatic attraction is generated between aluminum and the carbonyl group.

In order to confirm that TMA approaches a carbonyl group and is bonded thereto, verification was performed based on a DFT (Density Functional Theory) using a molecular orbital calculation program.

A molecular structure was calculated using a molecular orbital calculation program ("Gaussian09" manufactured by HPC SYSTEMS Inc., for example). A B3LYP (Becke, 3-parameter, Lee-Yang-Parr) method was used as a functional of the DFT. As a basis set for TMA and the polymer, 6-31G(d) was used. When the precursor contained heavy metal, LanL2DZ was used for the basis set for the precursor.

The stabilization energy of the precursor in a stabilized state is termed E1 and that the energy of the polymer in a stabilized state is termed E2. The energy in a state where the precursor is brought close to a segment at the center of the polymer from various directions followed by the precursor adsorbed to the polymer is termed E3. The overall stabilization energy is defined as ΔE, where ΔE=E1+E2−E3, the precursor is adsorbed to the polymer more stably when the stabilization energy ΔE has a larger negative value.

Figure 1B:
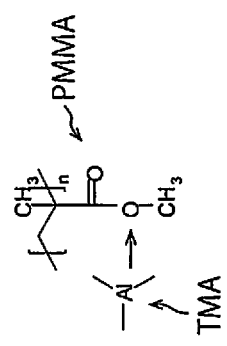
Figure 1A:
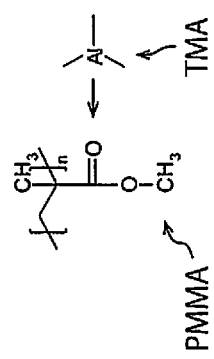

FIGS. 1A to 1C illustrate the stabilization energy ΔE when TMA is brought close to PMMA or PS (Polystyrene). In FIGS. 1A and 1B, PMMA is selected as a polymer. In FIG. 1C, PS is selected as a polymer. TMA is selected as a precursor in all FIGS. 1A to 1C.

When TMA is brought close to an oxygen atom of a carbonyl group at an ester bond portion of PMMA as indicated by an arrow in FIG. 1A, TMA is attracted to the carbonyl group and is adsorbed thereto. The stabilization energy ΔE was approximately −14.17 kcal/mol. The distance between the carbonyl group and Al was about 0.203 nanometer and sufficiently small. Accordingly, it was found out that TMA is adsorbed stably to the carbonyl group.

When TMA is brought close to an oxygen atom side bonded with a methyl group at the ester bond portion of PMMA as indicated by an arrow in FIG. 1B, TMA is dissociated and is not attracted. The stabilization energy ΔE was approximately −3.71 kcal/mol.

When TMA is brought close to a benzene ring of PS as indicated by an arrow in FIG. 1C, TMA is dissociated and is not attracted. The stabilization energy ΔE was approximately −2.66 kcal/mol. As described above, TMA is adsorbed to a polymer more stably as the stabilization energy ΔE has a larger negative value (ΔE is smaller) and thus it is known that TMA is attracted to a carbonyl group having electron pairs. That is, by increasing the density of carbonyl groups in a polymer, the polymer attracts TMA more stably and is metallized more easily.

TMA exists stably as a dimer rather than a monomer at a room temperature. When a monomer of TMA is transformed to a dimer, the stabilization energy ΔE becomes approximately −11.09 kcal/mol. On the other hand, when TMA is adsorbed to PMMA, the stabilization energy ΔE becomes approximately −14.17 kcal/mol. Therefore, TMA is stabilized more in a state of being adsorbed to PMMA than in a state of being existing as a dimer. Accordingly, TMA is easily adsorbed to PMMA also at a room temperature. However, the difference (3.08 kcal/mol) is small and TMA has a possibility of reverting to a dimer by a slight thermal disturbance.

From the calculations described above, PMMA is preferable to PS as a polymer in a pattern forming material. However, TMA adsorbed into a PMMA film is a little more stabilized than a dimer of TMA. Therefore, when the concentration of TMA is increased, more TMA can be adsorbed stably into a PMMA film. When exposure to an oxidant such as $H_2O$ is performed in a state where TMA is adsorbed into a PMMA film, the TMA adsorbed into the PMMA film is oxidized. Accordingly, an aluminum oxide or a hydroxide is deposited in PMMA.

(Stabilization Energies ΔE of Various Polymers and TMA)

Comparing the stabilization energies ΔE of the various polymers and TMA, it was found that a polymer having a carbonyl group in a molecular structure adsorbed TMA stably. It was also found that even having a similar molecular structure to that of PMMA, PVA (Polyvinylacetate) having a different side chain had a larger stabilization energy ΔE (that is, was more instable) than PMMA. Therefore, PMMA is more suitable as a polymer than PVA.

In order to enable TMA to be adsorbed stably to PMMA, it is preferable that the distance between an oxygen atom of a carbonyl group of a polymer and an Al atom of the TMA fall in a range from about 0.20 nanometer to 0.22 nanometer. It is considered that this is because TMA is stabilized due to the electron pairs of an oxygen atom. It is considered that adsorption of TMA to PMMA conversely becomes instable when the distance exceeds this range.

The stabilization energy ΔE has a positive correlation with a rate at which the film thickness changes when a polymer is metallized. That is, a polymer having a smaller stabilization energy ΔE (that is, being more stable) with TMA can adsorb more TMA in the polymer film and thus the film thickness is increased more when the polymer is metallized. Therefore, the change rate in the film thickness of a polymer before and after metallization can be used as an index for the stabilization energy ΔE.

(Various Precursors)

Adsorbing characteristics of precursors other than TMA are discussed. Possible precursors having a metallic element other than Al are $TiCl_4$, $WCl_6$, and $VCl_4$.

$TiCl_4$ was adsorbed to a carbonyl group of PMMA and the stabilization energy ΔE thereof was about −14.07 kcal/mol. There is TDMAT (Tetrakisdimethylaminotitanium) as a precursor for Ti. However, because having a large molecular size, TDMAT cannot approach as a ligand to the vicinity of the carbonyl group of a polymer and is not stabilized. Therefore, it is considered that a precursor having a small molecular size is advantageous.

$WCl_6$ was adsorbed to the carbonyl group and the stabilization energy ΔE was about −10.13 kcal/mol.

$VCl_4$ was adsorbed to the carbonyl group and the stabilization energy ΔE was about −14.47 kcal/mol.

From these results, also when $TiCl_4$, $WCl_6$, or $VCl_4$ is used as a precursor other than TMA, such a precursor can be used similarly to TMA when the molecular size is small.

(Polymer Structure)

The above discussions show that increasing the density of carbonyl groups in a polymer facilitates stable metallization of the polymer. Therefore, it is preferable that more carbonyl groups are formed in a monomer unit (hereinafter, also "one segment") of a polymer. Furthermore, it suffices that a precursor is adsorbed to a polymer to have the stabilization energy LE with a larger negative value (smaller) than the stabilization energy between precursors. It is considered that this facilitates metallization of the polymer.

In the present embodiment, a polymer including a plurality of carbonyl groups in a monomer unit is therefore used as a pattern forming material. For example, PAcMA (Polyacetonylmethacrylate) having two carbonyl groups is used as a polymer.

FIGS. 2A to 2C illustrate the stabilization energies ΔE when TMA is brought close to PAcMA. As illustrated in FIG. 2A, when TMA approaches a carbonyl group B1 located on a side close to a main chain of PAcMA, the TMA is attracted by the carbonyl group and adsorbs thereto. The stabilization energy ΔE becomes about −12.55 kcal/mol.

As illustrated in FIG. 2B, when TMA approaches a carbonyl group B2 located on a side far from the main chain of PAcMA, the TMA is attracted by the carbonyl group and adsorbs thereto. The stabilization energy ΔE becomes about −15.99 kcal/mol. That is, TMA adsorbs stably to the carbonyl group B2 on an outer side, which is less sterically hindered than the carbonyl group B1 on an inner side.

Furthermore, as illustrated in FIG. 2C, when two TMA are brought close to PAcMA, the TMA adsorb to the carbonyl groups B1 and B2, respectively. The stabilization energy ΔE is about −25.89 kcal/mol. In this way, TMA having adsorbed to one of the carbonyl groups B1 and B2 does not inhibit TMA from adsorbing to the other of the carbonyl groups B1 and B2.

FIGS. 3A to 4B illustrate the stabilization energies ΔE when TMA is brought close to PacacEMA (Poly (2-(acetoacetoxy)ethyl methacrylate) having three carbonyl groups. PacacEMA is a polymer having three carbonyl groups B11 to B13.

Figures 3A, 3B, 3C:
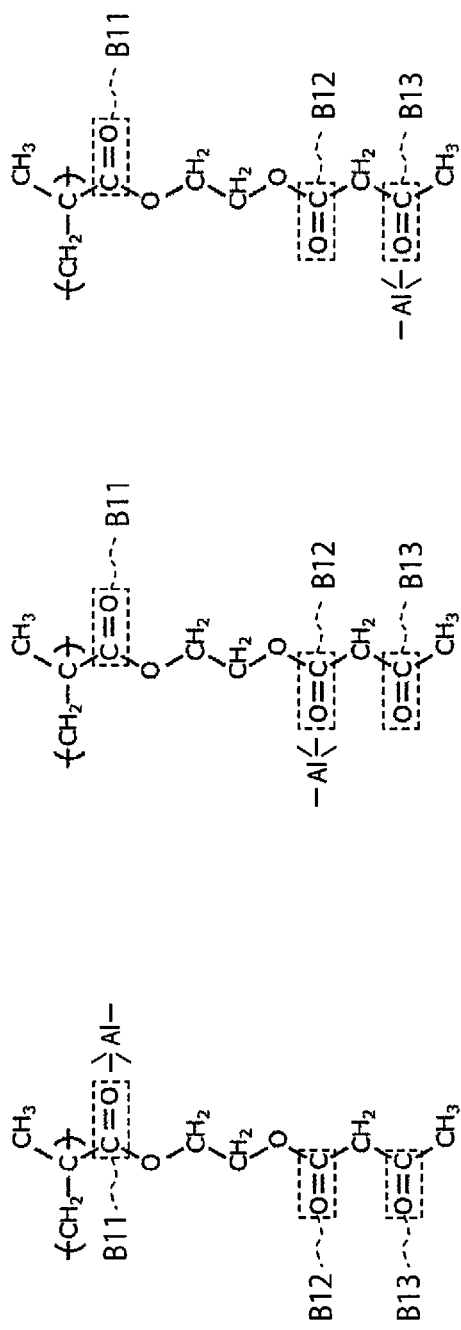

As illustrated in FIG. 3A, when TMA approaches the carbonyl group B11 located closest to a main chain of PacacEMA, the TMA is attracted by the carbonyl group B11 and adsorbs thereto. The stabilization energy ΔE was about −14.53 kcal/mol.

As illustrated in FIG. 3B, when TMA approaches the carbonyl group B12 located in the middle of PacacEMA, the TMA is attracted by the carbonyl group B12 and adsorbs thereto. The stabilization energy ΔE was about −17.47 kcal/mol.

As illustrated in FIG. 3C, when TMA approaches the carbonyl group B13 located at a farthest position from the main chain of PacacEMA, the TMA is attracted by the carbonyl group B13 and adsorbs thereto. The stabilization energy ΔE was about −15.82 kcal/mol.

That is, TMA adsorbs most stably to the middle carbonyl group B12 among the carbonyl groups B11 to B13.

As illustrated in FIG. 4A, when two TMA approach PacacEMA, the TMA adsorb to the two carbonyl groups B12 and B13 on an outer side, respectively. The stabilization energy ΔE was about −30.84 kcal/mol.

As illustrated in FIG. 4B, when three TMA approach PacacEMA, the TMA adsorb to the three carbonyl groups B11 to B13, respectively. The stabilization energy ΔE was about −43.81 kcal/mol.

As described above, it was found that three TMA could adsorb to PacacEMA stably even when three TMA approached PacacEMA at the same time. In the present embodiment, metallization of a polymer using the molecular orbital method was simulated.

(Linear Chain and Alicyclic Compound)

Figures 5, 6:
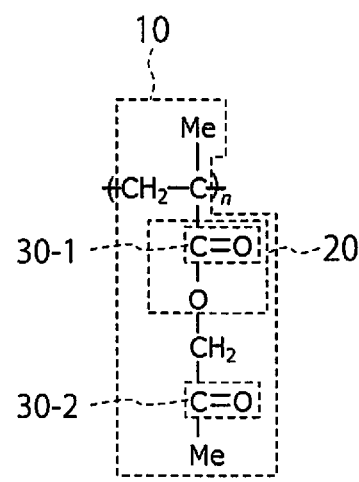
FIG. 5 is a table indicating the stabilization energies ΔE depending on compositions of a side chain of a polymer.
FIG. 6 is a composition diagram illustrating an example of the pattern forming material according to the present embodiment.

FIG. 5 is a table indicating the stabilization energies ΔE depending on compositions of a side chain of a polymer. This table indicates that TMA is stable when being adsorbed to a carbonyl group of a polymer located on an outermost side (a distal end) among a plurality of carbonyl groups thereof regardless of whether the side chain is a linear chain or an aliphatic cyclic compound (an alicyclic compound). This table also indicates that the stabilization energy ΔE is larger as TMA is adsorbed to a carbonyl group located on an inner side. That is, TMA is adsorbed to a carbonyl group located on an outer side of the side chain first. This shows that absorption of TMA to a carbonyl group located at the distal end of the side chain is important.

A comparison between a case where the side chain of a polymer is a linear chain and a case where the side chain is an alicyclic compound shows that the linear chain is more stable than the alicyclic compound. For example, when TMA was adsorbed to the carbonyl group B3 at the distal end of a linear chain, the stabilization energy ΔE was about −19.56 kcal/mol. When TMA was adsorbed to the carbonyl group B3 at the distal end of an alicyclic compound, the stabilization energy ΔE was about −17.90 kcal/mol. This is because when there is an alicyclic compound in the side chain of a polymer, the alicyclic compound becomes a steric hinderance and causes difficulty in adsorption of TMA. As described above, a polymer in which the side chain is a linear chain is more easily metallized with TMA and is more advantageous than a polymer in which the side chain is an alicyclic compound even when these polymers have similar molecular structures.

From the above discussions, it is found that the pattern forming material is preferably a polymer having a high density of carbonyl groups and including no alicyclic compound in the side chain.

FIG. 6 is a composition diagram illustrating an example of the pattern forming material according to the present embodiment. A polymer 1 illustrated in FIG. 6 is a polymer composed of a plurality of monomer units (monomers) 10 bonded to each other. The polymer 1 in FIG. 6 is, for example, PAcMA (Polyacetonylmethacrylate). In FIG. 6, n is a positive number equal to or larger than 2.

The monomer units 10 each include an ester structure 20 having a first carbonyl group 30_1, and at least one second carbonyl group 30_2.

The main chain of the polymer 1 can be formed of a plurality of the ester structures 20 sequentially bonded to each other. Me indicates a methyl group and the ester structure 20 is included in a methacrylic ester structure in this case.

The polymer 1 according to the present embodiment further includes the second carbonyl group 30_2 bonded to the first carbonyl group 30_1. The second carbonyl group 30_2 is bonded as a side chain to the main chain.

The distal end of the side chain has a methyl group connected to the second carbonyl group 30_2. The second carbonyl group 30_2 farthest from the ester structure 20 is not included in a cyclic structure such as a benzene ring or an alicyclic compound. That is, the side chain does not have a cyclic structure and is a linear chain.

As described above, the monomer unit 10 of the polymer 1 according to the present embodiment has the plural carbonyl groups 30_1 and 30_2. Furthermore, there is no cyclic structure such as a benzene ring or an alicyclic compound at the distal end of the side chain of the monomer unit 10. Therefore, the density of carbonyl groups included in the polymer 1 is high and the polymer 1 can adsorb more metallic precursors (TMA, for example). Furthermore, the polymer 1 can be metallized stably. For example, because the second carbonyl group 30_2 farthest from the main chain is in the form of a linear chain and is less sterically hindered, metal can be more easily adsorbed also to the first carbonyl group 30_1 in the ester structure 20.

Figure 7A:
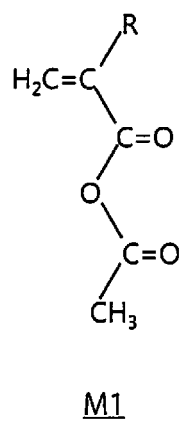
FIGS. 7A to 7E are composition diagrams illustrating examples of the monomer units constituting the polymer according to the present embodiment.
Figure 7B:
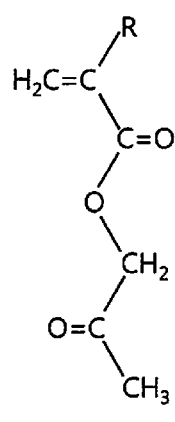
Figure 7C:
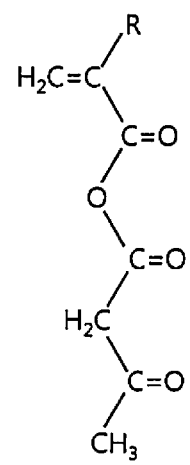
Figure 7D:
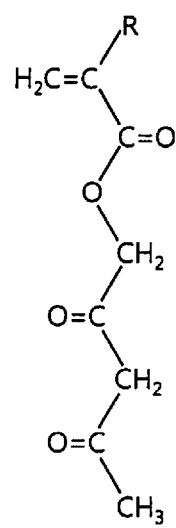
Figure 7E:
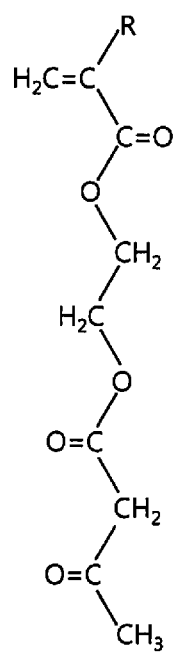

Monomer units of a polymer having identical characteristics can be, for example, a monomer containing at least one of (meth)acrylic acetic anhydride illustrated in FIG. 7A, acetonyl (meth)acrylate illustrated in FIG. 7B, (meth)acrylic acid-3-oxobutanoic anhydride illustrated in FIG. 7C, (meth) acrylic acid-2,4-dioxopentyl ester illustrated in FIG. 7D, and 2-(acetoacetoxy)ethyl (meth)acrylate illustrated in FIG. 7E. Each of the monomer units will be explained later with reference to FIGS. 7A to 7E.

The polymer according to the present embodiment can be a homopolymer composed of one type of the monomers described above as the monomer units 10. The polymer according to the present embodiment can alternatively be a copolymer composed of at least one type of the monomers described above as the monomer units 10. Furthermore, the polymer can be a polymer blend material being a blend of plural types of homopolymers each composed of one type of the monomers described above as the monomer units 10.

FIGS. 7A to 7E are composition diagrams illustrating examples of the monomer units constituting the polymer 1 according to the present embodiment.

FIG. 7A illustrates a monomer unit M1 having two carbonyl groups. When R is hydrogen (H), the monomer unit M1, is acrylic acetic anhydride. When R is a methyl group ($CH_3$), the monomer unit M1 is methacrylic acetic anhydride.

FIG. 7B illustrates a monomer unit M2 having two carbonyl groups. When R is hydrogen (H), the monomer unit M2 is acetonyl acrylate. When R is a methyl group ($CH_3$), the monomer unit M2 is acetonyl methacrylate.

FIG. 7C illustrates a monomer unit M3 having three carbonyl groups. When R is hydrogen (H), the monomer unit M3 is acrylic acid-3-oxobutanoic anhydride. When R is a methyl group ($CH_3$), the monomer unit M3 is methacrylic acid-3-oxobutanoic anhydride.

FIG. 7D illustrates a monomer unit M4 having three carbonyl groups. When R is hydrogen (H), the monomer unit M4 is acrylic acid-2,4-dioxopentyl ester. When R is a methyl group ($CH_3$), the monomer unit M4 is methacrylic acid-2,4-dioxopenthyl ester.

FIG. 7E illustrates a monomer unit M5 having three carbonyl groups. When R is hydrogen (H), the monomer unit M5 is 2-(acetoacetoxy)ethyl acrylate. When R is a methyl group ($CH_3$), the monomer unit M5 is 2-(acetoacetoxy)ethyl methacrylate.

The monomer units constituting the polymer 1 according to the present embodiment can be the monomer illustrated in any of FIGS. 7A to 7E.

The monomer units M3 to M5 are subjected to appropriate treatment in the polymer 1 to be insolubilized in a solvent. Accordingly, even when an SOG (Spin-On Glass) film or the like is coated on the pattern forming material containing an identical solvent, the pattern forming material does not dissolve and can maintain the shape.

The (acetoacetoxy)ethyl (meth)acrylate can also be insolubilized similarly.

The polymer 1 of the pattern forming material can be a copolymer being a combination of plural types of monomers. By adjusting the combination of plural types of monomers, it is possible to adjust characteristics of a copolymer, such as solubility in a solvent, a film forming property at the time of being coated, and a glass transition temperature of a film after coated. Examples of a copolymer being a combination of plural types of monomers are copolymers obtained by adding styrene, hydroxystyrene, (meth)acrylic acid methyl, (meth)acrylic acid ethyl, or (meth)acrylic acid hydroxylethyl to the monomer according to the present embodiment.

On the other hand, a copolymer obtained by adding a monomer including no carbonyl group to the monomer according to the present embodiment adversely reduces the density of carbonyl groups. Accordingly, it is preferable that the ratio of monomers including no carbonyl groups is suppressed to be lower than about 50 mol %.

The polymer 1 of the pattern forming material can alternatively be a copolymer or a polymer blend obtained by adding a monomer including no carbonyl group to any of the monomer units M3 to M5. This also can insolubilize the pattern forming material in a solvent.

A solvent that dissolves the polymer 1 according to the present embodiment to form a solution is not particularly limited. The solvent can be, for example, any of 1-butanol, N,N-dimethylformamide, N-methylpyrrolidone, γ-butyrolactone, acetone, anisole, isobutyl alcohol, isopropyl alcohol, isopentyl alcohol, ethylene glycol monoethyl ether, ethylene glycol monoethyl ether acetate, ethylene glycol mono-n-butyl ether, ethylene glycol monomethyl ether, ethylene glycol monomethyl ether acetate, xylene, cresol, cyclohexanol, cyclohexanone, tetrahydrofuran, toluene, ethyl lactate, propylene glycol monoethyl ether, propylene glycol monoethyl ether acetate, propylene glycol mono-n-butyl ether, propylene glycol monomethyl ether, propylene glycol monomethyl ether acetate, methyl ethyl ketone, methyl cyclohexanol, methyl cyclohexanone, methyl-n-butyl ketone, isobutyl acetate, isopropyl acetate, isopentyl acetate, ethyl acetate, n-butyl acetate, n-propyl acetate, or n-pentyl acetate.

(Relation Between Polymer Film Thickness and Metallization: Reference Example)

A reference example is explained first. In the reference example, PMMA having one carbonyl group is used as a polymer. A polymer solution is produced by dissolving 0.1 gram of PMMA illustrated in FIGS. 1A to 1C in 9.9 grams of propylene glycol monomethyl ether acetate. As illustrated in FIGS. 1A to 1C, PMMA has only one carbonyl group in the monomer unit. This polymer solution is spin-coated as a pattern forming material onto a silicon substrate. The film thickness of the pattern forming material is, for example, about 50 nanometers.

Next, the silicon substrate is placed in a vacuum chamber and is exposed to a TMA atmosphere. Accordingly, TMA is penetrated into the pattern forming material.

Subsequently, the silicon substrate is exposed to water vapor to oxidize TMA in the pattern forming material. When the film thickness of the pattern forming material was measured after vacuum drying, the film thickness was about 55 nanometers. That is, when PMMA was selected as the pattern forming material, the film increase rate of the pattern forming material after metallization was about 10%.

(Relation Between Polymer Film Thickness and Metallization: First Embodiment)

In contrast, a homopolymer or a copolymer illustrated in FIG. 8 is used as a pattern forming material according to a first embodiment. FIG. 8 is a table indicating a relation between the combination of monomer units constituting the pattern forming material and the film increase rate obtained by metallization of the pattern forming material according to the first embodiment.

First and second monomer units are any of monomers M1-H, M1-Me, M2-H, M2-Me, M3-H, M3-Me, M4-H, M4-Me, M5-H, and M5-Me. The monomers M1-H, M2-H, M3-H, M4-H, and M5-H are the monomers illustrated in FIG. 7 and are acrylic ester monomers. The monomers M1-Me, M2-Me, M3-Me, M4-Me, and M5-Me are the monomers illustrated in FIG. 7 and are methacrylic ester monomers.

In FIG. 8, for example, when the first and second monomer units are both the monomer M1-H, the pattern forming material becomes a homopolymer of M1-H. Similarly, when the first and second monomer units are both a same monomer (any of M2-H to M5-H and M1-Me to M5-Me), the pattern forming material becomes a homopolymer of that monomer.

For example, when the first monomer unit is the monomer M1-H and the second monomer unit is the monomer M1-Me, the pattern forming material becomes a copolymer of M1-H and M1-Me. Similarly, when the first and second monomer units are monomers different from each other, the pattern forming material becomes a copolymer including the first and second monomer units.

Synthesis of a homopolymer or a copolymer was performed in a manner described below. A total amount of 1 millimole of the first and second monomer units and 0.01 millimole of azobisisobutyronitrile were reacted with each other for 8 hours in 50 milliliters of THF (Tetrahydrofuran)

in a nitrogen atmosphere at 60° C. After reprecipitation in methanol, and dried in vacuum a homopolymer or a copolymer was obtained.

The pattern forming material was produced by dissolving 0.1 gram of the homopolymer or copolymer in 9.9 grams of propylene glycol monomethyl ether acetate. This pattern forming material was spin-coated onto a silicon substrate and was annealed for 10 minutes at 160° C. to obtain a thin film with a thickness of 50 nanometers.

Thereafter, the pattern forming material was metallized with TMA in the same manner as in the reference example, and the film increase rate was calculated.

In the table illustrated in FIG. 8, all the homopolymers or the copolymers obtained by combining the first and second monomer units have the film increase rate of about 20 to 50% after metallization. That is, it was found that the film thickness of the pattern forming material according to the present embodiment was increased by about 20 to 50% by the metallization due to TMA.

Compared to the film increase rate (10%) of PMMA in the reference example, the film increase rate of the pattern forming material according to the present embodiment is larger. This indicates that the pattern forming material according to the first embodiment can adsorb more metal than PMMA.

(Relation Between Polymer Film Thickness and Metallization: Second Embodiment)

FIG. 9 is a table indicating a relation between the combination of monomer units constituting a pattern forming material and the film increase rate obtained by metallization of the pattern forming material according to a second embodiment. The first monomer units according to the second embodiment are the same as those in the first embodiment. However, the second monomer units according to the second embodiment are materials different from the second monomer units according to the first embodiment.

The second monomer unit is any of St (Styrene), St-OH (Hydroxystyrene), MMA (Methyl methacrylate), MAA (Methyl acrylate), EMA (Ethyl methacrylate), EAA (Ethyl acrylate), HEMA (Hydroxylethyl methacrylate), and HEAA (Hydroxyl ethyl acrylate).

In the second embodiment, for example, when the first monomer unit is the monomer M1-H and the second monomer unit is St (Styrene), the pattern forming material becomes a copolymer of M1-H and St. Similarly, the pattern forming material becomes a copolymer of the first and second monomer units.

Synthesis of a copolymer can be performed in the same manner as that of the polymer described in the first embodiment. The pattern forming material also can be produced by the same method as that described above. Thereafter, the pattern forming material was metallized with TMA and the film increase rate was calculated in the same manner as that in the first embodiment.

In the table illustrated in FIG. 9, all the copolymers formed by combining the first and second monomer units have the film increase rate of about 10 to 30% after metallization.

Compared to the film increase rate (10%) of PMMA in the reference example, all the copolymers illustrated in FIG. 9 are larger in the film increase rate of the pattern forming material. This indicates that the pattern forming material according to the second embodiment can adsorb more metal than PMMA.

(Relation Between Polymer Film Thickness and Metallization: Third Embodiment)

In a third embodiment, the solvent used for the pattern forming material is changed. For example, a pattern forming material was produced by dissolving 0.1 gram of poly acetonyl acrylate in 9.9 grams of a solvent. The solvent used at this time is 1-butanol, N,N-dimethylformamide, N-methylpyrrolidone, γ-butyrolactone, acetone, anisole, isobutyl alcohol, isopropyl alcohol, isopentyl alcohol, ethylene glycol monoethyl ether, ethylene glycol monoethyl ether acetate, ethylene glycol mono-n-butyl ether, ethylene glycol monomethyl ether, ethylene glycol monomethyl ether acetate, xylene, cresol, cyclohexanol, cyclohexanone, tetrahydrofuran, toluene, ethyl lactate, propylene glycol monoethyl ether, propylene glycol monoethyl ether acetate, propylene glycol mono-n-butyl ether, propylene glycol monomethyl ether, propylene glycol monomethyl ether acetate, methyl ethyl ketone, methyl cyclohexanol, methyl cyclohexanone, methyl-n-butyl ketone, isobutyl acetate, isopropyl acetate, isopentyl acetate, ethyl acetate, n-butyl acetate, n-propyl acetate, or n-pentyl acetate.

The pattern forming material was metallized with TMA and the film increase rate was calculated in the same manner as that in the first embodiment. As a result, with use of any of the solvents, the film thickness of the pattern forming material was increased by about 50% after metallization. Therefore, it was found that the effect of the present embodiment was not lost with use of any of the solvents described above.

(Pattern Forming Method)

A pattern forming method according to the present embodiment is explained next.

FIG. 10A to FIG. 11D are sectional views illustrating an example of a pattern forming method according to a fourth embodiment. Any of the polymers and the solvents in the first to third embodiments described above can be used for a pattern forming material used in the pattern forming method according to the fourth embodiment.

Figure 10A:
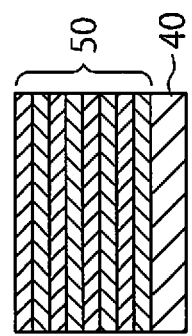

First, a stack body 50 is deposited on a semiconductor substrate 40 as illustrated in FIG. 10A. The semiconductor substrate 40 can be glass, silicon, quartz, mica, or the like. The stack body 50 is, for example, a stack body formed by alternately stacking silicon nitride films and silicon oxide films using the CVD method or the ALD method. The stack body 50 can be, for example, a stack body to be used when a solid memory cell array of a NAND EEPROM (Electrically Erasable Programmable Read-Only Memory) is manufactured. In the fourth embodiment, the stack body 50 being a processing target material is processed into a pattern with a high aspect ratio.

Figure 10B:
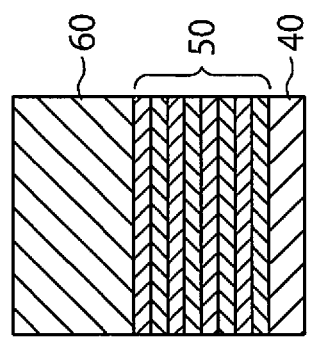

After the stack body 50 is formed, a pattern forming material 60 is coated on the stack body 50 as illustrated in FIG. 10B. The forming method of the pattern forming material 60 can be, for example, a spin coating method, a dip coating method, a bar coating method, or vapor deposition. More specifically, the pattern forming material 60 is produced by dissolving about 0.1 gram of the polymer 1 in 9.9 grams of propylene glycol monomethyl ether acetate. This pattern forming material 60 is spin-coated on the stack body 50. The semiconductor substrate 40 is annealed for 10 minutes in an atmosphere at about 160° C. to form the pattern forming material 60 with a thickness of 50 nanometers on the stack body 50. This annealing treatment can remove the solvent or moisture in the pattern forming material 60 or can insolubilize the pattern forming material 60 in the solvent. Insolubilizing the pattern forming material 60 in the solvent enables the pattern forming material 60 to be insolubilized in the same solvent for the pattern forming material 60 or a solvent for SOG.

The annealing temperature of the pattern forming material 60 is preferably equal to or higher than about 120° C. to remove moisture. In order to remove moisture more reliably, it is more preferable that the annealing temperature is equal to or higher than about 150° C. On the other hand, if heated at a temperature exceeding 400° C., the pattern forming material 60 is decomposed. Therefore, the pattern forming material 60 is heated preferably at a temperature lower than about 400° C., more preferably at a temperature lower than 300° C. Before the pattern forming material 60 is formed, the stack body 50 can be pretreated. The pretreatment can be, for example, plasma treatment, ultraviolet irradiation treatment, or exposure treatment to an acid or ozone.

Figure 10C:
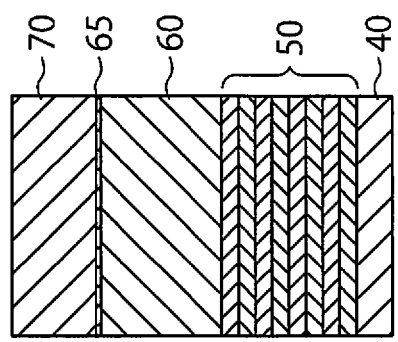

Next, an antireflective film 65 is deposited on the pattern forming material 60 as illustrated in FIG. 10C. For example, for light exposure with a wavelength of 193 nanometers of ArF laser, resin containing a benzene ring is used as the antireflective film 65, and a material such as novolac resin, phenol resin, or polyhydroxystyrene is used.

Subsequently, as illustrated in FIG. 10C, a SOG film 70 is coated on the antireflective film 65 and is heated for about 10 minutes in an atmosphere at about 230° C. to solidify the SOG film 70. The SOG film 70 can be replaced by a SOC (Spin-On Carbon) film.

Next, as illustrated in FIG. 11A, a resist film 80 is coated on the SOG film 70 using a lithography technique and the resist film 80 is patterned. The resist film 80 is patterned into a processing pattern of the stack body 50. For example, the resist film 80 is patterned into a plurality of hole patterns with a diameter of about 60 nanometers. The pitch between adjacent ones of the hole patterns is about 100 nanometers.

Next, the SOG film 70, the antireflective film 65, and the pattern forming material 60 are processed using the resist film 80 as a mask as illustrated in FIG. 11B. For example, the SOG film 70, the antireflective film 65, and the pattern forming material 60 are processed by a RIE (Reactive Ion Etching) method or a CDE (Chemical Dry Etching) method.

Accordingly, the patterns of the resist film 80 are transferred onto the SOG film 70, the antireflective film 65, and the pattern forming material 60.

Subsequently, after the SOG film 70 and the antireflective film 65 are removed, the semiconductor substrate 40 is placed in a vacuum chamber and is exposed for 10 minutes to gas or liquid of TMA at a temperature between 50° C. and 200° C. to bind TMA to the pattern forming material 60. If the gas or liquid has a temperature lower than 50° C., immersion of TMA becomes instable due to fluctuation of external air. On the other hand, if the temperature is equal to or higher than 200° C., TMA is difficult to adsorb to the pattern forming material 60. Next, the semiconductor substrate 40 is exposed to a water vapor atmosphere for 10 minutes to oxidize TMA in the pattern forming material 60. Accordingly, the pattern forming material 60 is metallized as illustrated in FIG. 11C.

After the semiconductor substrate 40 is dried in a vacuum, the stack body 50 is processed using the pattern forming material 60 as a mask. For example, the stack body 50 is processed by the RIE method or the CDE method using a $CF_4$ gas. Accordingly, the stack body 50 is processed into the hole patterns described above as illustrated in FIG. 11D. The pattern forming material 60 becomes a mask containing a relatively large amount of metal, having a high etching resistance, and being solid. Therefore, when the pattern forming material 60 is used as a mask, a pattern with a high aspect ratio can be easily formed on the stack body 50.

Thereafter, a memory cell array is formed by a known method. For example, when the hole patterns formed on the stack body 50 are used as memory holes, a block film, a charge accumulation layer, a gate dielectric film, and a silicon body are formed (not illustrated) as a memory structure in the memory holes. One (the silicon nitride film, for example) of the insulating films of the stack body 50 is then replaced by a conductive material such as polysilicon or metal that functions as word lines WL. The silicon body functions as a channel. The charge accumulation layer functions as a data storage layer that accumulates therein charges injected from the silicon body via the gate dielectric film. The block film suppresses the charges accumulated in the charge accumulation layer from diffusing to the word lines WL. In this way, the pattern forming material 60 can be used for formation of memory holes in a memory cell array, or the like.

In the fourth embodiment, the processing target material is the stack body 50. However, the processing target material is not particularly limited and can be the semiconductor substrate 40 or any other material layers. For example, the processing target material can be a single layer of the silicon dioxide films or the silicon nitride films. The processing target material can alternatively be a metal layer or a metallic compound layer to be used as a hard mask material. The metal layer or the metallic compound layer can be, for example, any of W, Ta, Mo, Al, Ti, Zr, and Hf. The processing target material can be a layer including a plurality of materials as the stack body 50.

(Notes)

A cyclic structure does not need to be bonded to the second carbonyl group farthest from the main chain of the polymer constituting the pattern forming material.

The pattern forming method according to the present embodiment can further includes, after coating the pattern forming material on the processing target material, forming a SOG film on the pattern forming material, and forming an antireflective film on the SOG film.

The metallic precursor can be any of TMA, $TiCl_4$, $WCl_6$, and $VCl_4$.

The monomer unit can include at least one of (meth)acrylic acetic anhydride, acetonyl (meth)acrylate, (meth)acrylic acid-3-oxobutanoic anhydride, (meth)acrylic acid-2,4-dioxopentyl ester, and 2-(acetoacetoxy)ethyl methacrylate.

The copolymer can include a copolymer of the monomer unit and any of styrene, hydroxystyrene, methyl (meth)acrylate, ethyl (meth)acrylate, and hydroxyethyl (meth)acrylate.

The solvent that dissolves the monomer unit can be any of 1-butanol, N,N-dimethylformamide, N-methylpyrrolidone, γ-butyrolactone, acetone, anisole, isobutyl alcohol, isopropyl alcohol, isopentyl alcohol, ethylene glycol monoethyl ether, ethylene glycol monoethyl ether acetate, ethylene glycol mono-n-butyl ether, ethylene glycol monomethyl ether, ethylene glycol monomethyl ether acetate, xylene, cresol, cyclohexanol, cyclohexanone, tetrahydrofuran, toluene, ethyl lactate, propylene glycol monoethyl ether, propylene glycol monoethyl ether acetate, propylene glycol mono-n-butyl ether, propylene glycol monomethyl ether, propylene glycol monomethyl ether acetate, methyl ethyl ketone, methyl cyclohexanol, methyl cyclohexanone, methyl-n-butyl ketone, isobutyl acetate, isopropyl acetate, isopentyl acetate, ethyl acetate, n-butyl acetate, n-propyl acetate, or n-pentyl acetate.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A pattern forming method comprising:
    coating a pattern forming material on a processing target material, the pattern forming material having a polymer comprising a plurality of monomer units bonded to each other, the bonded monomer units each including:
        an ester structure having a first carbonyl group; and
        at least one second carbonyl group bonded to the ester structure as a side chain(s), and a second carbonyl group among second carbonyl groups,
    which is farthest from a main chain of the polymer constituting the pattern forming material, being in a linear chain state;
    patterning the pattern forming material;
    exposing the patterned pattern forming material to gas or liquid of a metallic precursor to cause the pattern forming material to contain metal; and
    processing the processing target material using the pattern forming material containing the metal as a mask; wherein
    in the patterning, the pattern forming material is patterned using a CDE (Chemical Dry Etching) or an RIE (Reactive Ion Etching) process.

2. The method of claim 1, further comprising:
    after coating the pattern forming material on the processing target material,
    forming an antireflective film on the pattern forming material; and
    forming an SOG (Spin-On Glass) film on the antireflective film.

3. The method of claim 2, wherein the metallic precursor is any of TMA (Trimethylaluminum), $TiCl_4$, $WCl_6$, and $VCl_4$.

4. The method of claim 1, wherein the metallic precursor is any of TMA (Trimethylaluminum), $TiCl_4$, $WCl_6$, and $VCl_4$.

5. The method of claim 1, wherein no cyclic structure is bonded to the second carbonyl group farthest from the ester structure.

6. The method of claim 1, wherein the monomer units include at least one of (meth)acrylic acetic anhydride, acetonyl (meth)acrylate, (meth)acrylic acid-3-oxobutanoic anhydride, (meth)acrylic acid-2,4-dioxopentyl ester, and 2-(acetoacetoxy)ethyl (meth)acrylate.

7. The method of claim 6, wherein the monomer units include only one of (meth)acrylic acetic anhydride, acetonyl (meth)acrylate, (meth)acrylic acid-3-oxobutanoic anhydride, (meth)acrylic acid-2,4-dioxopentyl ester, and 2-(acetoacetoxy)ethyl (meth)acrylate.

8. The method of claim 1, comprising a copolymer of the monomer unit and any of styrene, hydroxystyrene, methyl (meth)acrylate, ethyl (meth)acrylate, and hydroxy ethyl (meth)acrylate.

9. The method of claim 1, further comprising a solvent dissolving the polymer, wherein
    the solvent is any of 1-butanol, N,N-dimethylformamide, N-methylpyrrolidone, γ-butyrolactone, acetone, anisole, isobutyl alcohol, isopropyl alcohol, isopentyl alcohol, ethylene glycol monoethyl ether, ethylene glycol monoethyl ether acetate, ethylene glycol mono-n-butyl ether, ethylene glycol monomethyl ether, ethylene glycol monomethyl ether acetate, xylene, cresol, cyclohexanol, cyclohexanone, tetrahydrofuran, toluene, ethyl lactate, propylene glycol monoethyl ether, propylene glycol monoethyl ether acetate, propylene glycol mono-n-butyl ether, propylene glycol monomethyl ether, propylene glycol monomethyl ether acetate, methyl ethyl ketone, methyl cyclohexanol, methyl cyclohexanone, methyl-n-butyl ketone, isobutyl acetate, isopropyl acetate, isopentyl acetate, ethyl acetate, n-butyl acetate, n-propyl acetate, or n-pentyl acetate.

10. The method of claim 1, wherein the polymer is a homopolymer or a copolymer composed of the monomer units.

11. The method of claim 1 further comprising:
    forming a resist film above the pattern forming material;
    patterning the resist film; and
    patterning the pattern forming material using a CDE or an RIE process.

12. The method of claim 1, wherein
    the processing target material is processed using a CDE or an RIE process.

* * * * *